(12) United States Patent
Matsumoto

(10) Patent No.: US 7,326,921 B2
(45) Date of Patent: Feb. 5, 2008

(54) OPTICAL RECEIVER WITH BIAS VOLTAGE ADJUSTED ACCORDING TO ADJUSTABLE BYPASS CURRENT

(75) Inventor: Kengo Matsumoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 39 days.

(21) Appl. No.: 11/185,964

(22) Filed: Jul. 21, 2005

(65) Prior Publication Data
US 2006/0016894 A1 Jan. 26, 2006

(30) Foreign Application Priority Data
Jul. 22, 2004 (JP) ............... 2004-214658

(51) Int. Cl.
- H01J 7/24 (2006.01)
- G01J 1/44 (2006.01)
- H01L 35/00 (2006.01)
- H04B 10/06 (2006.01)

(52) U.S. Cl. .............. 250/238; 250/214 R; 250/214 C; 327/513; 398/202

(58) Field of Classification Search ............ 250/214 R, 250/214.1, 238, 214 C; 327/512–514, 530, 327/538; 398/202; 361/94
See application file for complete search history.

(56) References Cited

U.S. PATENT DOCUMENTS

| | | | |
|---|---|---|---|
| 3,560,755 A * | 2/1971 | Blaise et al. ............ 250/214 R |
| 5,578,815 A * | 11/1996 | Nakase et al. ........... 250/214 R |
| 5,953,690 A * | 9/1999 | Lemon et al. ............... 702/191 |
| 6,157,022 A * | 12/2000 | Maeda et al. ............ 250/214 R |
| 6,188,059 B1 * | 2/2001 | Nishiyama et al. ..... 250/214 R |
| 6,313,459 B1 * | 11/2001 | Hoffe et al. ............. 250/214 R |
| 6,643,472 B1 * | 11/2003 | Sakamoto et al. ........... 398/202 |
| 2004/0079866 A1 * | 4/2004 | Nishiyama ............... 250/214 R |
| 2004/0129863 A1 * | 7/2004 | Cheung et al. .......... 250/214 C |
| 2004/0245436 A1 | 12/2004 | Matsumoto ............. 250/214 C |
| 2005/0001152 A1 * | 1/2005 | Stewart et al. .......... 250/214 R |

FOREIGN PATENT DOCUMENTS

JP  2004-040239  2/2004

* cited by examiner

Primary Examiner—Thanh X. Luu
Assistant Examiner—Pascal M Bui-Pho
(74) Attorney, Agent, or Firm—Smith, Gambrell & Russell, LLP

(57) ABSTRACT

The present invention is to provide an optical receiver by which the avalanche photodiode (APD) can be protected from the self-breakdown when the signal light with excess power enters therein. The APD is biased by the DC/DC converter via the control circuit including a resistor and a variable current source connected in series to the resistor and in parallel to the APD. The resistor drops the bias voltage to the APD by the current provided from the variable current source. The controller adjusts the amount of the current flowing in the variable current source not to exceed the absolute maximum current for the APD. Accordingly, the multiplication factor of the APD is appropriately adjusted.

14 Claims, 7 Drawing Sheets

| $T_1(=0°C)$ | $T_2(=25°C)$ | $T_3(=50°C)$ |
|---|---|---|
| $I_{CMAX1}$ | $I_{CMAX2}$ | $I_{CMAX3}$ |
| $V_{MIN1}$ | $V_{MIN2}$ | $V_{MIN3}$ |
| $V_{MAX1}$ | $V_{MAX2}$ | $V_{MAX3}$ |
| $I_{REF1}$ | $I_{REF2}$ | $I_{REF3}$ |

OPTICAL RECEIVER WITH BIAS VOLTAGE ADJUSTED ACCORDING TO ADJUSTABLE BYPASS CURRENT

BACKGROUND OF THE INVENTION

1. Field of the Invention

The present invention relates to an optical receiver, in particular, relates to an optical receiver for the avalanche photodiode.

2. Related Prior Art

Optical communication often uses an avalanche photodiode (hereinafter denoted as APD) for a light-receiving device because the an APD has an intrinsic characteristic to multiply photo carriers and to output a photocurrent relatively larger than that of a PIN photodiode. Japanese Patent Application published as 2004-040239 has disclosed a method for controlling the photocurrent generated in the APD by controlling a bias voltage applied to the APD.

On the other hand, it is necessary that, when the optical communication system equips a fiber amplifier, an excess optical input power, such as over 0 dBm, enters the APD due to an optical surge or an operational miss handling. Receiving such excess optical power at the optical receiver, the APD generates excess carriers, which is equivalent to the excess photocurrent, and may be broken itself by this photocurrent.

SUMMARY OF THE INVENTION

Therefore, an object of the present invention is to provide an optical receiver, in which the APD installed therein can be protected from the self-breakdown with a simple configuration even when the light with excess power enters therein.

One aspect of the present invention relates to an optical receiver that receives an optical signal and outputs an electrical signal corresponding to the optical signal. The optical receiver comprises an avalanche photodiode (APD), an adjusting circuit, and a controller. The APD converts the optical signal into a photocurrent depending on a bias voltage applied thereto in a temperature. The adjusting circuit outputs the bias voltage by adjusting the DC voltage input thereto in accordance with a control signal. The adjusting circuit includes a resistor and a variable current source. The resistor is inserted between the APD and the DC voltage, and the variable current source is connected in serial to the resistor and in parallel to the APD. The variable current source outputs a control current to the resistor. Thus, the bias voltage may be lowered by the product of the resistor and the control current with respect to the DC voltage. The controller outputs the control signal to the adjusting circuit. The control signal depends on the photocurrent, the bias voltage, and the temperature.

The optical receiver of the invention may further comprise a current monitor, a voltage monitor, and a temperature monitor for monitoring the photocurrent, the bias voltage and the temperature of the APD, and for outputting a current monitored signal, a voltage monitored signal, and a temperature monitored signal to the controller, respectively. The controller may output the control signal in accordance with each current monitored signal, the voltage monitored signal and the temperature monitored signal.

The optical receiver of the invention may further include a processing unit, a memory, and a D/A converter in the controller. The memory may include a look-up-table that holds a relation of the control current against the photocurrent, the bias voltage, and the temperature.

Another aspect of the invention relates to a method for controlling a photocurrent output from an avalanche photodiode (APD) under a condition that a bias voltage is applied from a DC source through a resistor. The resistor, in addition to the photocurrent, leads a bypass current therethrough. The bypass current, which does not flow in the APD, is adjusted by the controller. The method comprises steps of (a) obtaining the photocurrent by a current monitor and adjusting the bypass current until the photocurrent becomes smaller than a maximum limit; (b) obtaining the bias voltage by the voltage monitor and adjusting the bypass current until the bias voltage becomes greater than a minimum voltage; (c) obtaining the bias voltage by the voltage monitor and adjusting the bypass current until the bias voltage becomes smaller than a maximum voltage; and (d) obtaining the photocurrent by the temperature monitor and adjusting the bypass current until the photocurrent becomes substantially equal to a reference current.

The APD is thus controlled in its photocurrent and the bias voltage applied thereto, the APD may be not only prevented from breaking by the photocurrent generated by itself but also show a frequency bandwidth enough for transmitting a high frequency optical signal over 10 Gbps.

The method of the present invention may further include, before the step for obtaining the photocurrent, a step for obtaining a latest temperature of the APD, and the maximum limit may reflect this latest temperature. The method of the present invention may further include, before the step for obtaining the bias voltage, a step for obtaining a latest temperature of the APD, and the minimum voltage or the maximum voltage may reflect this latest temperature. The method of the present invention may further include, before the step for obtaining the photocurrent at aforementioned step (d), a step for obtaining a latest temperature of the APD, and the reference current may reflect this latest temperature. Otherwise, the method may include, before the step for obtaining the photocurrent, a step for obtaining a latest temperature of the APD, and the maximum limit, the minimum and maximum voltages, and the reference current may reflect this latest temperature.

The reflection of the latest temperature may be carried out such that, a plurality of groups including the maximum limit of the photocurrent, the minimum and maximum voltage of the bias voltage, and the reference current is stored in a memory look-up-table combined with a temperature in advance to the process. In accordance with the latest temperature, the maximum limit, the minimum and maximum voltages, and the reference current are calculated by the interpolation/extrapolation of the plurality of grouped parameters.

Otherwise, the reflection of the latest temperature may be carrier out such that, a plurality of groups including the maximum limit of the photocurrent, the minimum and maximum voltages of the bias voltage, and the reference current is stored in a memory look-up-table combined with a temperature in advance to the process. Subsequently to the obtaining of the latest temperature, one group combined with the temperature nearest to the latest temperature may be selected from the memory look-up-table.

DESCRIPTION OF PREFERRED EMBODIMENTS

Next, embodiments of the present invention will be described as referring to accompanying drawings. In the description, the same symbols or numerals will refer the same elements in drawings and description without overlapping explanation.

Figure 1:
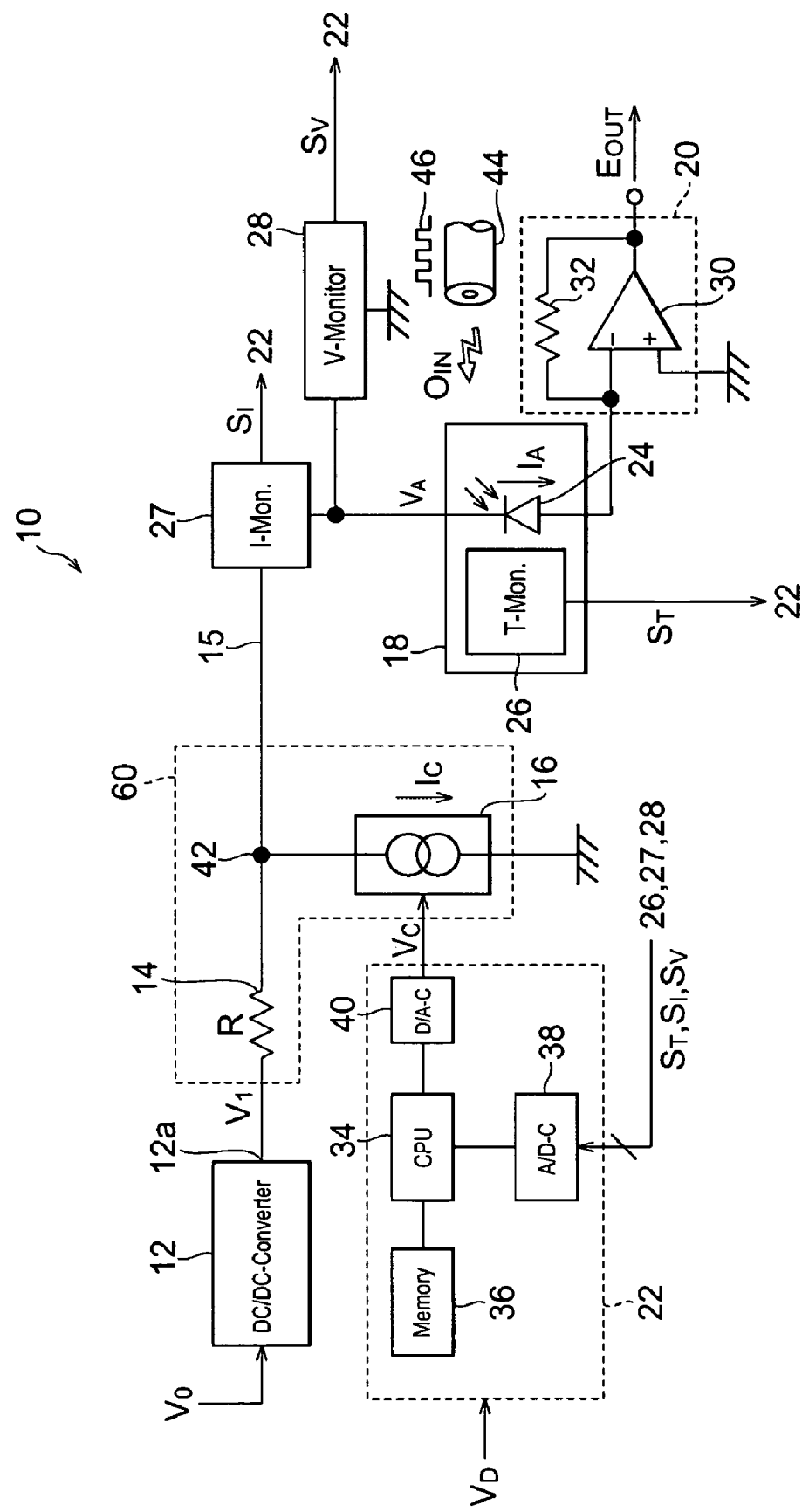
FIG. 1 is a block diagram of the optical receiver according to the present invention.

FIG. 1 is a block diagram of an optical receiver according to the present invention. The optical receiver 10 comprises a DC/DC converter 12, a resistor 14, a variable current source 16, a photodiode module 18, an amplifier 20, and a controller 22. These blocks will be described successively.

The DC/DC converter 12 is a power supply, by receiving DC voltage V0 from the outside, to output a DC voltage V1 in the output terminal 12a thereof by transforming the input voltage V0. The output voltage V1 is supplied to an avalanche photodiode 24, which is denoted as APD hereinafter, in the photodiode module 18 to operate the APD in a reverse bias condition. A bias pass 15 connects the output terminal 12a to the cathode electrode of the APD 24.

The resistor 14 and the variable current source 16 constitute a bias adjusting circuit 60, which adjusts the reverse bias voltage supplied to the APD 24 via the bias pass 15. One terminal of the resistor 14 connects to the output terminal 12a of the DC/DC converter 12, while the other terminal thereof connects to the variable current source 16 via the node 42 on the bias pass 15. The resistor 14 causes a voltage drop depending on a current flowing therethrough. This voltage drop may adjust the reverse bias voltage to the APD. The variable current source 16 controls the current flowing in the resistor 14. Thus, the resistor 14 yields the voltage drop between terminals thereof depending on the control current $I_C$ determined by the variable current source 16. As described later in this specification, a control signal $V_C$ sent to the variable current source 16 from the controller 22 determines the magnitude of the control current $I_C$.

The photodiode module 18 builds in the APD 24 and a temperature sensor 26. The DC/DC converter generates the output $V_1$ and the reverse bias voltage $V_A$ is supplied to the APD 24 after adjusted by the bias adjusting circuit 60 to drive the APD 24. The APD 24 receives an optical signal $O_{IN}$ output from the optical waveguide 44 to generate a photocurrent $I_A$, which alternates depending on the optical signal $O_{IN}$. The temperature sensor 26, which may be a thermistor, is arranged neighbor to the APD 24 to monitor a temperature of peripheral regions of the APD 24. The temperature sensor 26 output a monitoring signal $S_T$ to send it to the controller 22.

The anode electrode of the APD 24 connects the amplifier 20. In the present embodiment, the amplifier includes a trans-impedance amplifier 30 with a feedback resistor 32. This trans-impedance amplifier 30 converts the photocurrent $I_A$ generated by the APD 24 into a voltage signal $E_{out}$ with an optimized conversion factor. When the optical signal $O_{IN}$ is modulated, the optical receiver 10, responding to this modulated optical signal $O_{IN}$, outputs the electrical signal $E_{OUT}$ including the transmitted data 46 and the clock synchronized to the data.

The amplifier 20 is not restricted to the trans-impedance amplifier 30. One modification of the amplifier 20 may include a load resistor connected to the anode electrode of the APD 24 and a voltage amplifier that amplifies a voltage generated between terminals of this load resistor.

Between the node 42 and the cathode electrode of the APD 24 on the bias line 15 is inserted with a current monitor 27 that monitors the photocurrent $I_A$ generated by the APD 24. The current monitor 27 converts the photocurrent $I_A$ into a corresponding voltage signal $S_I$ to send it to the controller 22. Japanese Patent Application published as 2004-040239, which has the same inventor with the present application, has disclosed a substantial example of the current monitor 27 that includes a current mirror circuit and a load resistor.

The controller 22, as explained later in this specification, controls the voltage drop at the resistor 14 by adjusting the control current $I_C$ output from the variable current source 16. This voltage drop at the resistor reflects in the reverse bias voltage supplied to the APD 24, and affects the multiplication factor thereof Accordingly, to adjust the control current $I_C$ reflects in the characteristic of the APD 24. The controller 22 comprises a CPU 34, a memory 36, an A/D converter 38, and a D/A converter 40. The memory 36 holds a program and a data for the CP 34 to control the bias voltage $V_A$ to the APD 24. The controller 22 operates by supplying the power $V_D$ thereto from the outside of the receiver 10. The CPU 34 first executes the program stored in the memory 36 to adjust the reverse bias voltage $V_A$ for the APD 24. The A/D converter 38 converts the monitored signal $S_T$ for a temperature, the monitored signal $S_I$ for the photocurrent, and the monitored signal $S_V$ for the reverse bias voltage into corresponding digital values, and sends them to the CPU 34. The D/A converter 40 converts the digital control signal generated by the CPU 34 into the corresponding analog signal $V_C$, and sends it to the variable current source 16. Thus, the control current $I_C$ generated by the current source 16 varies in accordance with this analog signal $V_C$.

Figures 2, 3:
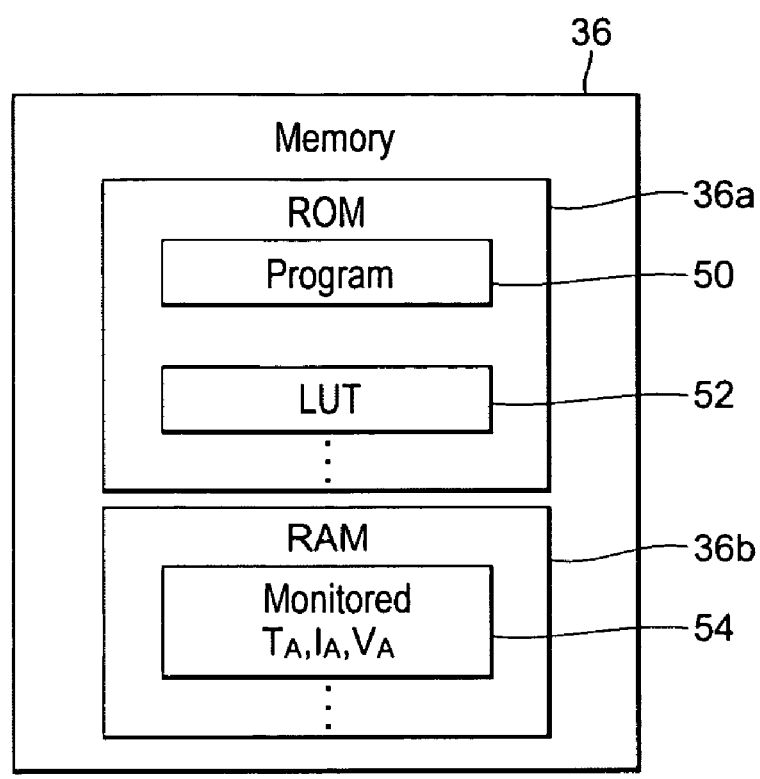
FIG. 2 is a schematic view of the storage.
FIG. 3 is a schematic view showing the LUT (Look-Up-Table) of the invention.

FIG. 2 is a schematic diagram, i.e., the architecture, of the memory 36, which comprises a Read-Only-Memory (ROM) 36a and a Random-Access-Memory (RAM) 36b. The ROM 36a stores a program 50 for control the APD 24 and a look-up-table (LUT) 52 used in this controlling, but the ROM 36a may keep other parameters and programs. The RAM 36b is the primary storage for the CPU 34 to execute the program 50. Turning on the optical receiver 10, the CPU 34 transfers the program stored in the ROM 36a into the RAM 36b and executes thus transferred program 50. During the execution, the CPU 34 stores the signals, $T_A$, $I_A$, and $V_A$, monitored by the temperature monitor 26, the current monitor 27, and the voltage monitor 28, respectively, into the RAM 36b. These data are converted by respective signals $S_T$, $S_I$, and $S_V$, into corresponding digital values by the A/D converted 38.

FIG. 3 shows a schematic architecture of the LUT 52. The LUT 52 stores a combination of the maximum control current $I_{CMAX}$, the minimum voltage $V_{MIN}$, the maximum voltage $V_{MAX}$, and the reference current $I_{REF}$ for various reference temperatures. The controller 22 controls the APD 24 in accordance with this LUT 52. The present embodiment sets three reference temperatures, $T_1=0$ C, $T_2=25$ C, and $T_3=50$ C. In FIG. 3, respective parameters, $I_{CMAX}$, $V_{MIN}$, $V_{MAX}$, and $I_{REF}$ add a numeral subscript corresponding to the temperature. The maximum control current $I_{CMAX}$ means the current admitted to flow in the APD 24 when the APD 24 is put in its characteristic temperature. The maximum and the minimum voltage, $V_{MAX}$ and $V_{IMN}$, denote the maximum and minimum bias voltage $V_A$ admitted to supply to the APD 24 when the APD 24 is put in its characteristic temperature. The reference current $I_{ref}$ denotes the standard current to be flow in the APD 24 when the APD 24 is put in its characteristic temperature.

Referring to FIG. 1 again, since the control current $I_C$ together with the photocurrent $I_A$ flows in the resistor 14, the voltage drop $\Delta V$ due to this current becomes:

$$\Delta V = (I_A + I_C) * R. \qquad (1)$$

Thus, the voltage drop varies with the control current $I_C$. The bias voltage $V_A$ applied to the APD 24 becomes the output $V_1$ of the DC/DC converter 12 subtracted by this voltage drop $\Delta V$:

$$V_A = V_1 - \Delta V. \qquad (2)$$

Thus, the bias voltage $V_A$ varies with the voltage drop $\Delta V$ by the resistor. Accordingly, the controller 22 can adjust the bias voltage $V_A$ applied to the APD 24 through the control signal $V_C$. The photocurrent $I_A$ flowing in the APD 24 increases as the multiplication factor increases, and the multiplication factor increases as the bias voltage $V_A$ to the APD increases. Thus, to control the control current $I_C$ results on the controlling of the photocurrent $I_A$.

A high frequency performance and a low noise characteristic may be compatible in the APD 24 to adjust the multiplication factor thereof via the applied bias voltage depending on average optical input power $O_{IN}$, which is equivalent to the optical input level. For instance, it may be realizable to get both the wide bandwidth over 7 GHz and the high sensitivity to acquiring a smaller optical level by a superior low noise characteristic, which enables the optical receiver to be used in the high-speed optical communication at 10 Gbps with the acceptable error rate at quite low input level below −24 dBm. On the other hand, when the optical input level is high, to adjust the multiplication factor of the APD 24 through the bias voltage thereto may suppress the excess current flowing in the APD 24. The controller 22 may execute such control mentioned above through adjusting the control current $I_C$.

Figure 4:
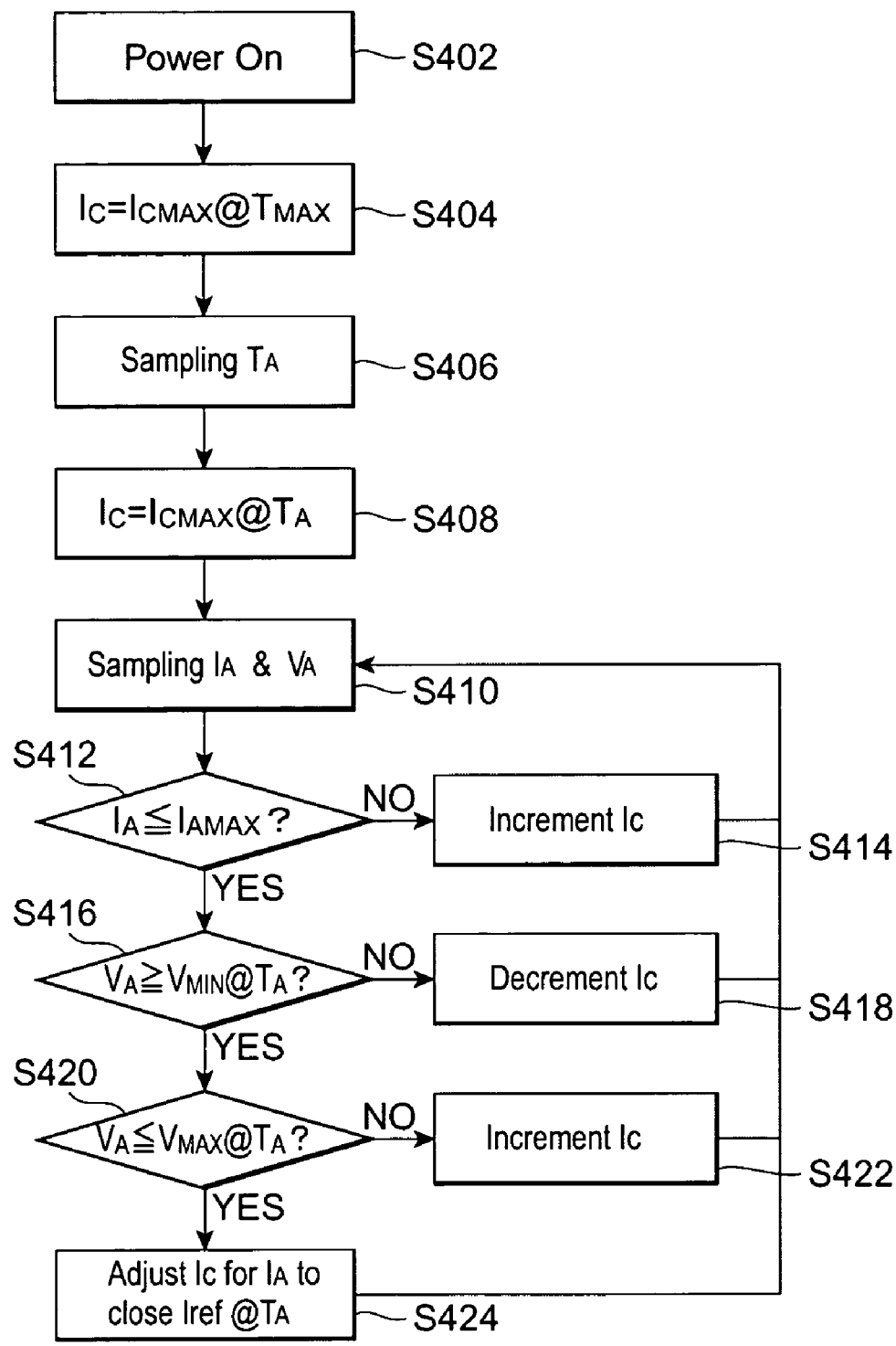
FIG. 4 is a flow chart for adjusting the control current.
Figure 5:
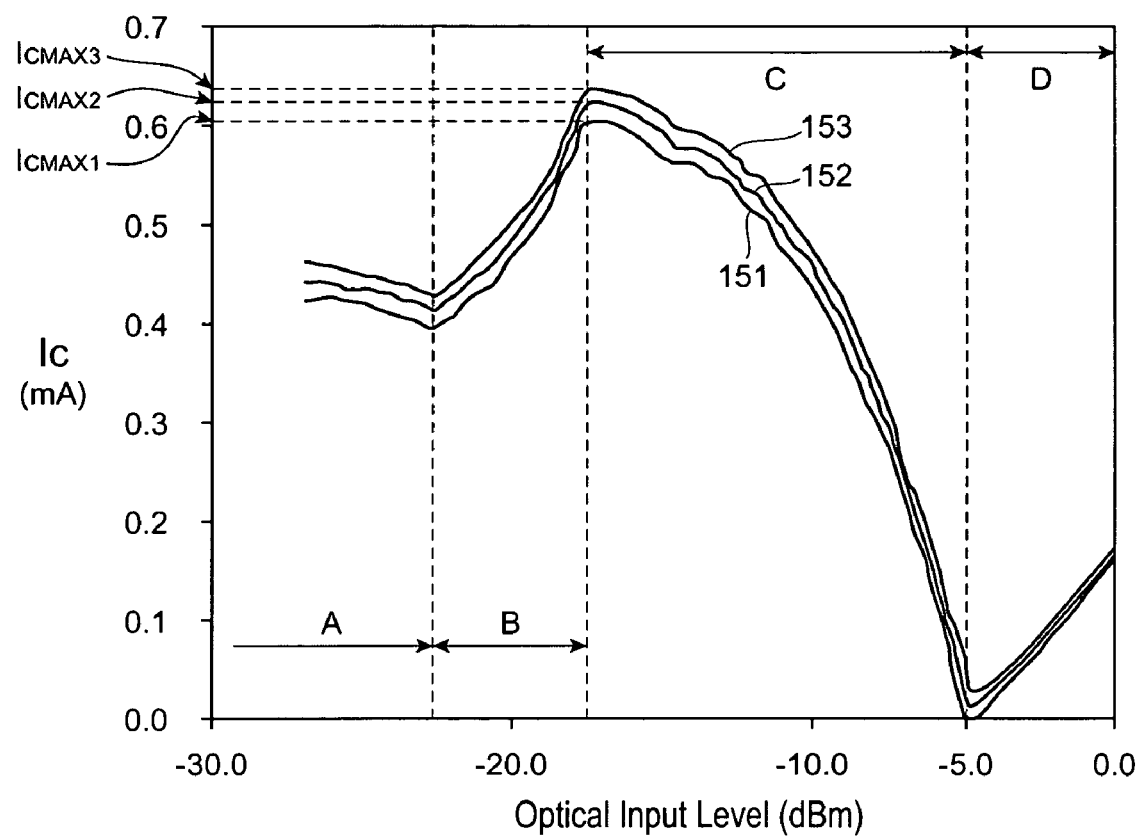
FIG. 5 shows a relation between the optical input level to the control current.

Next, the sequence for controlling the control current $I_C$ will be described as referring to FIGS. 4 to 8. FIG. 4 is a flow chart showing the control sequence of the control current $I_C$. From FIG. 5 to FIG. 8 illustrate relations of the control current $I_C$, the bias voltage $V_A$, the multiplication factor M, and the photocurrent $I_A$ to the optical input level, respectively. FIG. 5 also shows the temperature dependence of the control current $I_C$, denoted as 151, 152 and 153 in the figure, that is, the control current $I_C$ when the temperatures $T_A$ of the APD 24 is set to $T_1$, $T_2$, and $T_3$. Similarly, FIG. 6 includes the temperature dependence of the bias voltage $V_A$, 161, 162, and 163, when the temperature of the $T_A$ is at $T_1$, $T_2$, and $T_3$, respectively. But FIG. 7 and FIG. 8 show characteristics of the multiplication factor M and the photocurrent $I_A$ at only one temperature.

As shown in FIG. 9, the sequence for controlling the control current $I_C$ starts by turning on the power for the optical receiver 10 (at the step S402). Turing on the optical receiver 10, the controller 22 is supplied with the power $V_D$ to start thereof. In the same time, the DC/DC-converter 12 is input with $V_0$.

First, the controller operates the control current $I_C$ such that an excess bias voltage is never supplied to the APD 24 at the step S404. The CPU 34 determines the maximum control current $I_{CMAX}$ at the maximum operating temperature $T_{MAX}$, for instance 50 C, and adjusts the control signal $V_C$ such that the variable current source 16 generates this maximum control current $I_{CMAX}$. The LUT 52 is preferable to hold the maximum control current $I_{CMAX}$ at the upper limit temperature $T_{MAX}$ in advance to the operation. In such case, the CPU 34 only fetches these parameters from the LUT 52 to execute the following steps. Without the LUT 52 storing these parameters therein, the CPU 34 may calculate the maximum control current $I_{CMAX}$ at the upper limit temperature from the parameter at the other temperatures held in the LUT 52. Adjusting the control signal $V_C$ and generating the maximum control current $I_{CMAX}$ at the upper limit temperature $T_{MAX}$, a large voltage drop operates in the output $V_1$ of the DC/DC converter 12, which enough drops the bias voltage supplied to the APD 24. Consequently, the APD 24 is prevented from the excess bias voltage just after the turning on the power.

Next, the controller 22 receives the monitoring signal $S_T$ from the temperature sensor 26, which denotes the temperature $T_A$ of the APD 24, converts it to the corresponding digital parameter, and stores thus converted parameter into the parameter storing region 54 in the RAM 36b at the step S406. This parameter corresponds to the latest temperature of the APD 24. Subsequently, the CPU 34 determines the maximum control current $I_{CMAX}$ at the temperature $T_A$, and adjusts the control signal $V_C$ for the variable current source 16 to generate this maximum control current $I_{CMAX}$ at the step S408. The determination of the $I_{CMAX}$ at the temperature $T_A$ may be carried by the interpolation or the extrapolation using a portion or all of the maximum control currents $I_{CMAX1}$ to $I_{CMAX3}$ and corresponding temperatures thereto, all of which are held in the LUT 52 and by using the latest temperature $T_A$ of the APD 24. Generating the maximum control current $I_{CMAX}$ at the latest temperature $T_A$ of the APD by the control signal $V_C$, the bias voltage $V_A$ supplied to the APD is set to the lowest value. Thus, the multiplication factor M of the APD 24 is adjusted in accordance with the latest temperature $T_A$ thereof.

Subsequently, the CPU 34 receives the monitored signal $S_I$ and $S_V$ from the current monitor 27 and the voltage monitor 28, respectively, converts these data into corresponding digital data of the photocurrent $I_A$ and the bias voltage $V_A$, and stores these parameters into the parameter storing region 54 in the RAM 36b, at the step S410. The CPU 34 continues the controlling of the APD 24 through the control current $I_C$ using thus received photocurrent $I_A$ and the bias voltage $V_A$ shown as in FIGS. 5 to 8. Next, the sequence of the control will be described.

First, the CPU 34 compares the photocurrent $I_A$ with the maximum photocurrent $I_{AMAX}$ at the step S412. The maximum photocurrent $I_{AMAX}$ may be included in the ROM 36a or the program may include it. The maximum photocurrent $I_{AMAX}$ is determined from the viewpoint of the protection of the APD 24. Generally, the maximum photocurrent $I_{AMAX}$ is set to be not exceeding the absolute maximum current of the APD 24, more preferably, smaller than a half of the absolute current.

When the CPU 34 decides that the photocurrent $I_A$ exceeds the maximum photocurrent $I_{AMAX}$, which condition is denoted as "NO" in the figure, the CPU 34 increases the control current IC to decrease the photocurrent $I_A$ so as to be less than the maximum photocurrent $I_{AMAX}$ at the S414. The CPU 34 may increase the control current by a predetermined magnitude, or may change the control current to the value $(V_1 - V_A)/R - I_{AMAX}$. Subsequently, the CPU 34 gets the photocurrent $I_A$ and the bias voltage $V_A$ through the current monitor 27 and the voltage monitor 28, and compares the photocurrent with the maximum photocurrent $I_{AMAX}$ at the step S412. Thus, the sequence from the step S410 to the step S414 is iterated until the photocurrent $I_A$ becomes less than the maximum photocurrent $I_{AMAX}$.

When the CPU 34 decides that the photocurrent $I_A$ is less than the maximum photocurrent $I_{AMAX}$ at the step S412, which is denoted as "YES" in FIG. 4, the CPU 34 compares the bias voltage $V_A$ with the minimum voltage $V_{MIN}$ at the latest temperature $T_A$ of the APD 24, at the step S416. In precise, the CPU 34 gets the monitored signal $S_T$ from the temperature sensor 26, and revises the parameter for the latest temperature held in the RAM 36b. The CPU 34 calculates the minimum voltage $V_{MIN1}$ at the latest temperature $T_A$ by the interpolation or the extrapolation using a portion or all of the minimum voltages, $V_{MIN1}$ to $V_{MIN3}$, and corresponding temperatures thereto, all of which are held in the LUT 52. The CPU 34 compares the bias voltage $V_A$ with thus calculated minimum voltage $V_{MIN}$.

When the CPU 34 decides that the bias voltage $V_A$ is less than the minimum voltage $V_{MIN}$ at the latest temperature $T_A$, which corresponds to "NO" in FIG. 4, the CPU 34 decreases the control current $I_C$ and increases the bias voltage $V_A$ for the APD 24 to close to the minimum voltage $V_{MIN}$. The CPU 34 may increase the control current $I_C$ by a predetermined amount, or may change the control current to a value, $(V_1-V_{MIN})/R-I_A$. Subsequently, the CPU 34 gets the photocurrent $I_A$ and the bias voltage $V_A$ again at the step S410, and carries out the process after the step S412. Thus, the processes after the step S410 is to be iterated until the photocurrent $I_A$ becomes smaller than the maximum photocurrent $I_{AMAX}$, and, at the same time, the bias voltage $V_A$ becomes greater than the minimum voltage $V_{MIN}$.

When the CPU 34 decides that the bias voltage is greater than the minimum voltage at the latest temperature $T_A$, which corresponds to "YES" at the step S416 in FIG. 4, the CPU 34 compares the bias voltage $V_A$ with the maximum voltage $V_{MAX}$ at the latest temperature $T_A$, at the step S418. In precise, the CPU 34 gets the monitored signal $S_T$ from the temperature sensor 26, and rewrites the latest temperature $T_A$ of the APD 24 set in the RAM 36b. The CPU 34 calculates the maximum voltage at the latest temperature $T_A$ by the interpolation and the extrapolation using a portion or all of the maximum voltages, $V_{MAX1}$ to $V_{MAX3}$, and corresponding temperatures thereto, which are held in the LUT 52, and the latest temperature. The CPU 34 compares the bias voltage $V_A$ with thus calculated maximum voltage $V_{MAX}$.

When the CPU 34 decides that the bias voltage $V_A$ exceeds the maximum voltage $V_{MAX}$, which corresponds to "NO" at the step S420 in FIG. 4, the CPU 34 increases the control current $I_C$ to decrease the bias voltage $V_A$ at the step S422. The CPU 34 may increase the control current $I_C$ by a predetermined amount, or may change the control current $I_C$ to a value, $(V_1-V_{MAX})/R-I_A$. Subsequently, the CPU 34 gets the photocurrent $I_A$ and the bias voltage $V_A$ again at the step S410, and carries out the process after the step S412. Thus, the processes after the step S412 are to be iterated until the photocurrent $I_A$ becomes smaller than the maximum photocurrent $I_{AMAX}$, and, at the same time, the bias voltage $V_A$ becomes greater than the minimum voltage $V_{MIN}$.

When the CPU 34 decides that the bias voltage $V_A$ is less than the minimum voltage $V_{MAX}$ at the latest temperature $T_A$, which corresponds to "YES" at the step S420 in FIG. 4, the CPU 34 controls the control current $I_C$ for the photocurrent $I_A$ to close to the reference current $I_{REF}$. In precise, the CPU 34 gets the monitored signal $S_T$ from the temperature sensor 26, and rewrites the latest temperature $T_A$ of the APD 24 set in the RAM 36b. The CPU 34 calculates the reference current $I_{REF}$ at the latest temperature $T_A$ by the interpolation and the extrapolation using a portion or all of the reference currents, $I_{REF1}$ to $I_{REF3}$, and corresponding temperatures thereto, which are held in the LUT 52, and the latest temperature $T_A$. The CPU 34 compares the photocurrent $I_A$ with thus calculated reference current $I_{REF}$ and adjusts the control current IC based on the comparison. For, instance, the CPU 34 increases the control current IC when the photocurrent $I_A$ exceeds the reference current $I_{REF}$, $I_A>I_{REF}$, decreases the control current $I_C$ in the case of $I_A<I_{REF}$, and maintains the present status when $I_A=I_{REF}$.

Subsequently, the control sequence returns the step S410. Thus, the controller 22 adjusts the photocurrent $I_A$ of the APD 24 below the maximum photocurrent $I_{AMAX}$, and the bias voltage $V_A$ over the minimum voltage $V_{MIN}$ and below the maximum voltage $V_{MAX}$, and the photo, thereafter the photocurrent $I_A$ be equal to the reference current $I_{REF}$.

Figure 6:
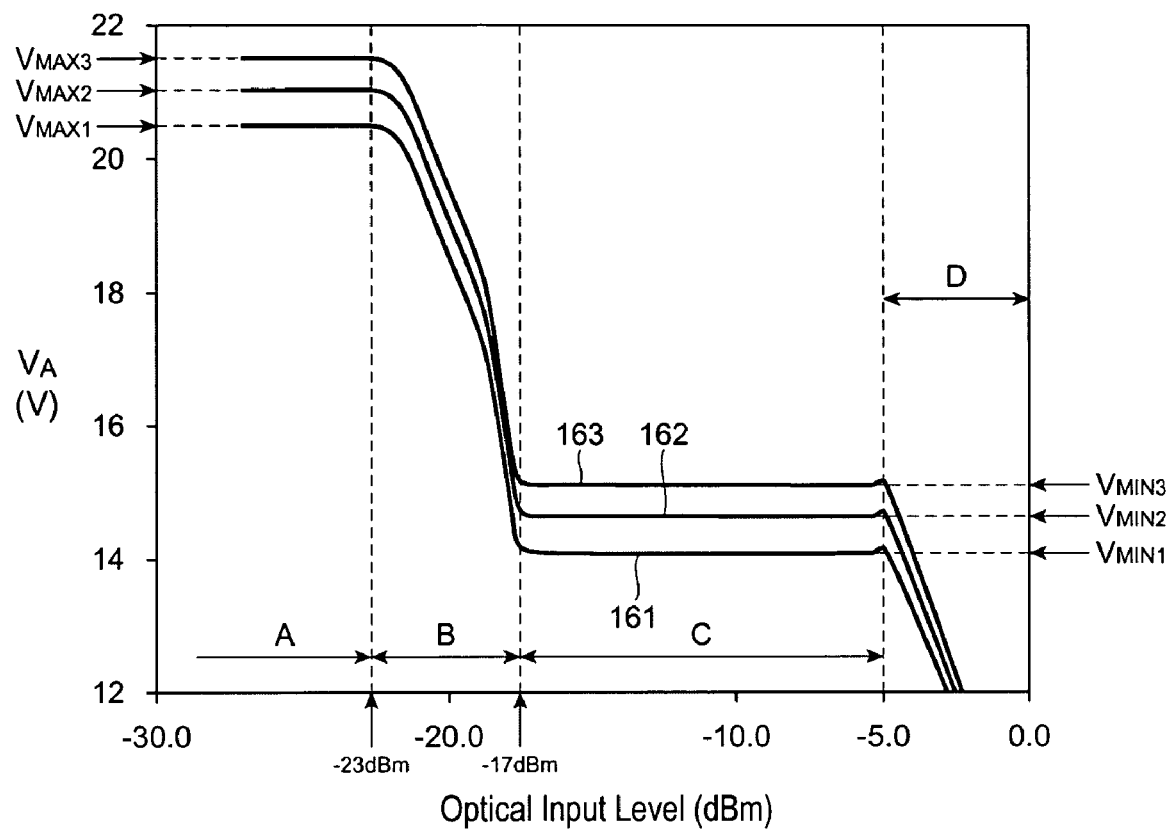
FIG. 6 shows a relation between the optical input level to the reverse bias voltage.
Figure 7:
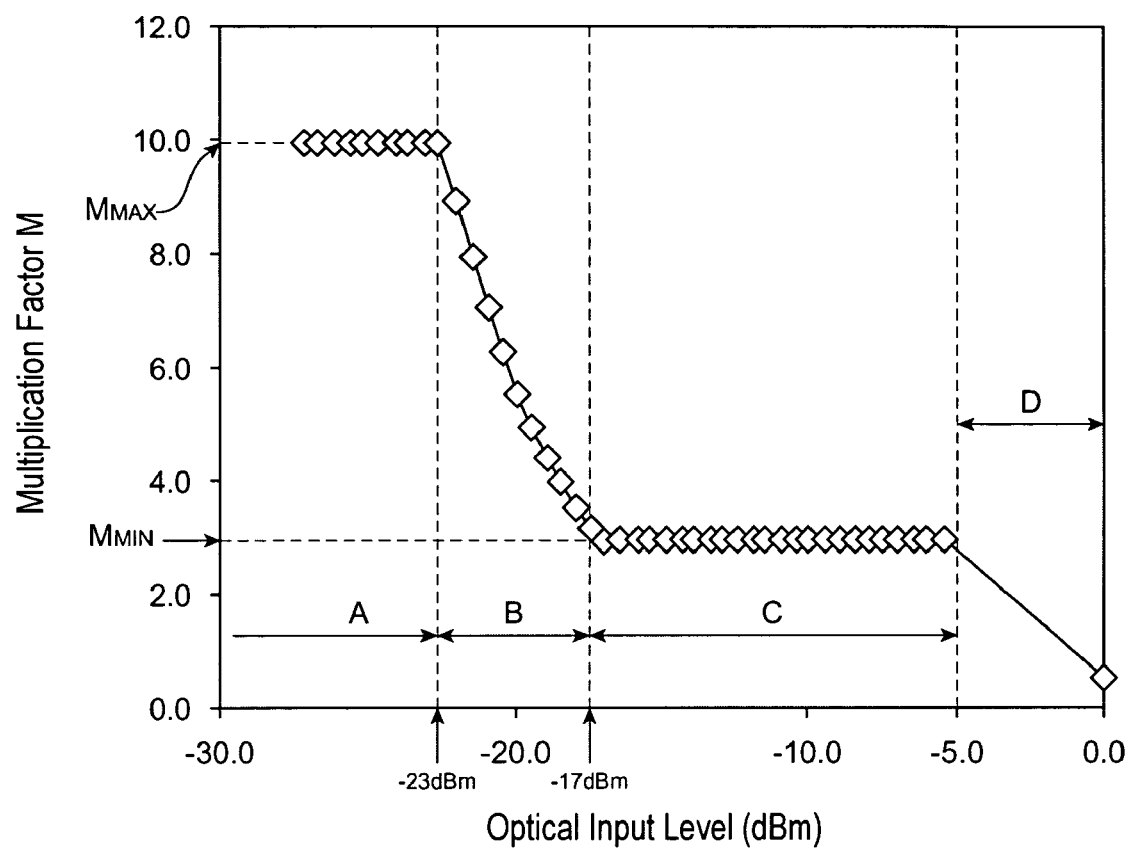
FIG. 7 shows a relation between the optical input level to the multiplication factor of the avalanche photodiode.
Figure 8:
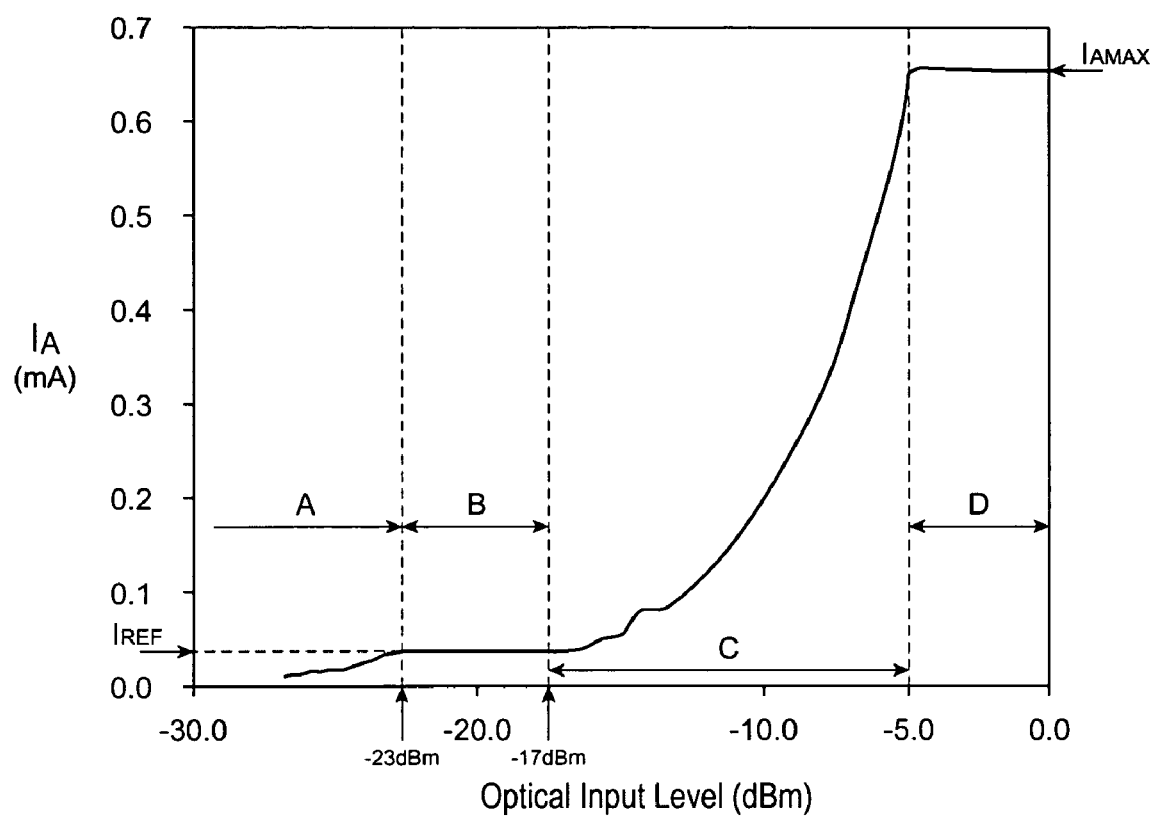
FIG. 8 shows a relation between the optical input level to the current flowing in the avalanche photodiode.

Next, the sequence to adjust the control current IC will be further precisely explained as referring to FIGS. 5 to 8. These drawings divide the optical input level into four regions, A to D. As explained, the controller 22 adjusts the control current $I_C$ depending on the photocurrent $I_A$. The photocurrent $I_A$ depends on the optical input level, consequently, the control current $I_C$ is adjusted depending on the optical input level. In regions from A to C, where the photocurrent $I_A$ is below the maximum photocurrent $I_{MAX}$, the control current $I_C$ is adjusted to convert the optical input signal $O_{IN}$ into corresponding electrical output $E_{OUT}$ with an acceptable conversion error. The controller 22, as long as the bias voltage $V_A$ is between the minimum voltage $V_{MIN}$ and the maximum voltage $V_{MAX}$, adjusts the control current to be substantially equal to the reference current $I_{REF}$ by which the appropriate response of the APD 24 can be obtained. Accordingly, as shown in FIG. 8, the photocurrent $I_A$ may be kept, in the region B, to the reference current $I_{REF}$ even the optical input level varies. To get such response for the photocurrent $I_A$, the controller 22 increases the control current $I_C$ to decrease the bias voltage $V_A$, and accordingly the multiplication factor M of the APD 24 in the region B as the optical input level increases, as shown in FIGS. 5 to 7.

As shown in FIG. 6, in a boundary between the region B and the region A, which corresponds to smaller input level, the bias voltage $V_A$ reaches the maximum voltage $V_{MAX}$. To maintain the condition $I_A=I_{REF}$ in the region A, the bias voltage $V_A$ must be further increased, which results in a condition of the bias voltage $V_A$ greater than the maximum voltage $V_{MAX}$, and accordingly the multiplication factor M exceeds the maximum multiplication factor $M_{MAX}$. However, an excess multiplication factor causes a less bandwidth. Therefore, the controller 22, as explained hereinbefore, makes the bias voltage $V_A$ close to the maximum voltage $V_{MAX}$ by increasing the control current $I_C$. Consequently, as shown in FIG. 6 and FIG. 7, the bias voltage $V_A$ may be maintained to the maximum voltage $V_{MAX}$ so the multiplication factor M to the maximum $M_{MAX}$ in the region A. Thus, the bandwidth necessary to the signal transmission may be secured.

The maximum multiplication factor $M_{MAX}$ is preferably a value by which the necessary bandwidth for the predetermined transmission speed can be obtained. For instance, the bandwidth greater than 7 Gbps, which is necessary for the transmission at 10 Gbps, may be obtained in the multiplication factor M of the APD 24 smaller than 10. In such case, the maximum multiplication factor set by the sequence is preferably 10, and the maximum bias voltage $V_{MAX}$ may be set depending on this maximum multiplication factor $M_{MAX}$.

Referring to FIG. 6 again, in a boundary between the region B and the region C, where the optical input level increases, the bias voltage $V_A$ of the APD 24 reaches the minimum voltage $V_{MIN}$. To maintain the condition of $I_A = I_{REF}$, the bias voltage $V_A$ must be further decreased, which causes the bias voltage $V_A$ smaller than the minimum voltage $V_{MIN}$ and the multiplication factor M smaller than the minimum $M_{MIN}$. In the case that the multiplication factor M becomes small in excessive, the bandwidth necessary to the signal transmission can not be secured. Therefore, as explained hereinbefore, the controller 22, when the bias voltage $V_A$ becomes smaller than the minimum $V_{MIN}$, decreased the control current IC for the bias voltage $V_A$ to close to the minimum $V_{MIN}$. Accordingly, as shown in FIG. 6 and FIG. 7, the bias voltage $V_A$ may be kept constant to the minimum $V_{MIN}$ in the region C, which also keeps the multiplication factor M the minimum $M_{MIN}$. Thus, the bandwidth necessary to the signal transmission can be secured.

The minimum multiplication factor $M_{MIN}$ is preferably a value by which the necessary bandwidth for the predetermined transmission speed can be obtained. For instance, the bandwidth greater than 7 Gbps, which is necessary for the transmission at 10 Gbps, may be obtained in the multiplication factor M of the APD 24 greater than 3. In such case, the minimum multiplication factor set by the sequence is preferably 3, and the minimum bias voltage $V_{MIN}$ may be set depending on this minimum multiplication factor $M_{MIN}$.

As shown in FIG. 8, the photocurrent $I_A$ increases as the optical input level increases in the region C. In a boundary between the region C and the greater input level region D, greater than −5 dBm and smaller than 0 dBm in FIG. 8, the photocurrent $I_A$ reaches the maximum photocurrent $I_{AMAX}$. As explained hereinbefore, the controller 22, when the photocurrent $I_A$ becomes greater than the maximum photocurrent $I_{MAX}$, increases the control current $I_C$ for the photocurrent $I_A$ to close to the maximum $I_{MAX}$. Accordingly, as shown in FIGS. 5 to 7, the photocurrent $I_A$ may be kept constant to the maximum $I_{MAX}$ in the region D. A photocurrent exceeding the maximum photocurrent can be prevented.

Thus, the present invention is described as referring to embodiments and accompanying drawings thereto. However, the present invention is not restricted to those embodiments, and has a various modifications. For example, the embodiments calculate the parameters corresponding to the latest temperature of the APD by the extrapolation and the interpolation of values and corresponding temperatures thereto held in the memory. However, the decision of the control parameter is not restricted to those calculations. The LUT holds a plurality, for example more than three, of parameters and their corresponding temperatures. The CPU may fetch the combination of parameters from the memory their corresponding temperature is closest to the latest temperature and may use these parameters read from the memory for the adjusting of the control current $I_C$.

Or, although the embodiment includes the DC/DC converter therein, the DC/DC converter may be installed outside the optical receiver.

What is claimed is:

1. An optical receiver for receiving an optical signal and outputting an electrical signal corresponding to said optical signal, said optical receiver comprising:
   an avalanche photodiode for converting said optical signal into a photocurrent corresponding to said optical signal depending on a bias voltage applied to said avalanche photodiode at a temperature;
   an adjusting circuit for outputting said bias voltage by adjusting a DC voltage input to said adjusting circuit in accordance with a control signal; and
   a controller for outputting said control signal to said adjusting circuit in accordance with said photocurrent and said temperature of said avalanche photodiode,
   wherein said adjusting circuit includes a resistor and a variable current source, said resistor being connected in serial to said avalanche photodiode, said variable current source being connected in serial to said resistor and in parallel to said avalanche photodiode, and
   wherein said variable current source outputs a control current in accordance with said control signal output from said controller, said bias voltage being lowered by a product of the resistance of said resistor and said control current from said DC voltage applied to said adjusting circuit.

2. The optical receiver according to claim 1, further comprises a current monitor for monitoring said photocurrent generated by said avalanche photodiode and outputting a current monitored signal to said controller, said controller outputting said control signal in accordance with said current monitored signal.

3. The optical receiver according to claim 1, further comprises a voltage monitor for monitoring said bias voltage and for outputting a voltage monitored signal to said controller, said controller outputting said control signal in accordance with said voltage monitored signal.

4. The optical receiver according to claim 1, further comprises a temperature monitor for monitoring said temperature of said avalanche photodiode and for outputting a temperature monitored signal to said controller, said controller outputting said control signal in accordance with said temperature monitored signal.

5. The optical receiver according to claim 1, wherein said controller includes a central processing unit, a memory, and a D/A converter, said memory including a look-up-table for holding a relation of said control current against said photocurrent, said bias voltage, and said temperature, said central processing unit fetching said control current from said look-up-table in accordance with said photocurrent, said bias voltage, and said temperature, and outputting said control current through said D/A converter.

6. A method for controlling a photocurrent output from an avalanche photodiode that is biased with a bias voltage applied through an adjusting circuit comprising a resistor and a variable current source, said resistor being connected in serial to said avalanche photodiode, said variable current source being connected in serial to said resistor and in parallel to said avalanche photodiode, said photocurrent being controlled by adjusting a bypass current flowing through said adjusting circuit and not flowing in said avalanche photodiode, said method comprising the steps of:
   (a) monitoring said photocurrent by a current monitor and adjusting said bypass current with said adjusting circuit until said photocurrent becomes smaller than a maximum current limit;
   (b) monitoring said photocurrent by a current monitor and adjusting said bypass current with said adjusting circuit until said photocurrent becomes greater than a minimum voltage;

(c) monitoring said bias voltage by said voltage monitor and adjusting said bypass current with said adjusting circuit until said bias voltage becomes smaller than a maximum voltage; and (d) monitoring said photocurrent by said current monitor and adjusting said bypass current with said adjusting circuit until said photocurrent becomes substantially equal to a reference current.

7. The method according to claim 6, further comprises a step, before said step (a), for monitoring a latest temperature of said avalanche photodiode, wherein said maximum current limit reflects said latest temperature.

8. The method according to claim 6, further comprises a step, before said step (b), for monitoring a latest temperature of said avalanche photodiode, wherein said minimum voltage reflects said latest temperature.

9. The method according to claim 6, further comprises a step, before said step (c), for monitoring a latest temperature of said avalanche photodiode, wherein said maximum voltage reflects said latest temperature.

10. The method according to claim 6, further comprises a step, before said step (d), for monitoring a latest temperature of said avalanche photodiode, wherein said reference current reflects said latest temperature.

11. The method according to claim 6, further comprises a step, before said step (a), for monitoring a latest temperature of said avalanche photodiode, wherein said maximum current limit, said minimum voltage, said maximum voltage, and said reference current reflect said latest temperature.

12. The method according to claim 11, wherein said reflection of said maximum current limit, said minimum voltage, said maximum voltage, and said reference current is carried out by, in accordance with said latest temperature of said avalanche photodiode, an interpolation or an extrapolation of a plurality of grouped parameters including said maximum current limit, said minimum voltage, said maximum voltage, and said reference current combined with a temperature stored in a memory look-up-table in advance of execution of said method.

13. The method according to claim 6, wherein a plurality of grouped parameters including said maximum current limit, said minimum voltage, said maximum voltage, and said reference current combined with indexed temperature are held in a memory look-up-table in advance of said step (a), and wherein said method further comprises, before said step (a), a step for monitoring a latest temperature of said avalanche photodiode, and selecting one of said grouped parameters combined with said indexed temperature closest to said latest temperature of said avalanche photodiode from said memory look-up-table.

14. The method according to claim 6, further comprises a step, before said step (a), for setting said bypass current to a predetermined maximum current.

* * * * *